United States Patent
Tsai et al.

(10) Patent No.: US 7,067,340 B1
(45) Date of Patent: Jun. 27, 2006

(54) FLIP-CHIP LIGHT EMITTING DIODE AND FABRICATING METHOD THEREOF

(75) Inventors: Tzong-Liang Tsai, Hsinchu (TW); Chih-Sung Chang, Hsinchu (TW); Tzer-Perng Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 11/142,082

(22) Filed: May 31, 2005

(30) Foreign Application Priority Data

Feb. 5, 2005 (TW) .............................. 94104049 A (51) Int. Cl.
*H01L 21/66* (2006.01)
(52) U.S. Cl. ...................................................... 438/47
(58) Field of Classification Search .................. 438/15, 438/22–29, 33, 42, 106–110, 118, 119, 121, 438/123–128, 453, 456, 460, 481, 617
See application file for complete search history.

(56) References Cited

U.S. PATENT DOCUMENTS

| | | | |
|---|---|---|---|
| 6,458,612 B1 * | 10/2002 | Chen et al. ..................... 438/29 |
| 6,583,448 B1 * | 6/2003 | Lin et al. ........................ 257/99 |
| 6,613,610 B1 * | 9/2003 | Iwafuchi et al. ............. 438/128 |
| 6,686,218 B1 * | 2/2004 | Lin et al. ........................ 438/29 |
| 6,949,395 B1 * | 9/2005 | Yoo ............................. 438/47 |
| 2002/0123164 A1 * | 9/2002 | Slater et al. ................... 438/39 |
| 2003/0100140 A1 * | 5/2003 | Lin et al. ..................... 438/106 |
| 2003/0173602 A1 * | 9/2003 | Hsu et al. .................... 257/290 |
| 2003/0209714 A1 * | 11/2003 | Taskar et al. .................. 257/79 |
| 2004/0115849 A1 * | 6/2004 | Iwafuchi et al. ............... 438/25 |
| 2004/0259282 A1 * | 12/2004 | Oohata .......................... 438/34 |
| 2005/0017262 A1 * | 1/2005 | Shei et al. ................... 257/103 |
| 2005/0077532 A1 * | 4/2005 | Ota et al. ...................... 257/98 |

* cited by examiner

*Primary Examiner*—Michael Lebentritt
*Assistant Examiner*—Andre' Stevenson
(74) *Attorney, Agent, or Firm*—Ingrassia Fisher & Lorenz (57) ABSTRACT

A flip-chip light emitting diode and fabricating methods are disclosed. A soft transparent adhesive layer is utilized to past a transparent conductive substrate onto a light emitting diode epitaxy structure on a substrate, and the substrate is next removed entirely. Then, a mesa-etching process is performed to form a first top surface and a second top surface on the light emitting diode epitaxy structure for respectively exposing an n-type layer and a p-type layer in the light emitting diode epitaxy structure. Next, a metal reflective layer and a barrier layer are formed on the light emitting diode epitaxy structure in turn, and electrodes are finally fabricated on the barrier layer.

20 Claims, 7 Drawing Sheets

FLIP-CHIP LIGHT EMITTING DIODE AND FABRICATING METHOD THEREOF

PRIORITY CLAIM

This Application claims priority of Taiwan Patent Application No. 094104049 filed on Feb. 5, 2005.

FIELD OF THE INVENTION

The present invention relates to a flip-chip light emitting diode (LED) and its fabricating method, and more particularly, to a flip-chip LED with high light output intensity and its fabricating methods.

BACKGROUND OF THE INVENTION

Because of the low cost, simple structure, low power consumption and small size, the light emitting diode (LED) is applied in display and illumination technologies.

For general LED fabrication, an LED epitaxy structure is formed on a substrate directly, while a cathode electrode and an anode electrode are respectively fabricated on different sides of the substrate. This conventional structure has a better current spreading efficiency, but an increased LED package area is necessary. Therefore, a flip-chip LED has been gradually developed over the last few years.

The p-type semiconductor layer and the n-type semiconductor layer of the flip-chip LED are exposed on the same side of the LED epitaxy structure in the flip-chip LED fabrication to allow the anode electrode and the cathode electrode to be on the same side of the LED, and the LED epitaxy structure with electrodes can thus be flipped onto a solder directly by flip-chip packaging technology. Thus, conventional wire bonding for the package is not necessary, and a smaller package size and higher device reliability are obtained.

However, the light emitted upward from the flip-chip LED is absorbed by the substrate and cannot pass through the substrate for complete outward output. Therefore, although the flip-chip LED is beneficial for device package, the flip-chip LED suffers a lowered LED light output intensity.

Further, the field of LED technology is highly focused on the development of LED with higher brightness. Unfortunately, only the light emitted upward from the LED counts as light output; the light emitted downward is partially absorbed by the material below the LED and cannot be another source for light output. More particularly, the light emitted downward from the flip-chip LED is easily blocked and scattered by electrodes. Thus, the light output of the LED only depends on the luminance properties of the LED itself, and the light output intensity is limited in improvement.

SUMMARY OF THE INVENTION

One aspect of the present invention is to provide a flip-chip LED with the superiority of the flip-chip structure, and to efficiently increase the light output intensity of the LED, the product quality and brightness of the LED is thereby greatly improved.

A metal reflective layer of the LED of the present invention has a high reflectivity, results in the light from the LED epitaxy structure to the electrodes reflects to the internal medium of the LED, the brightness of the LED is thereby increased.

The interface of the LED epitaxy structure and the transparent substrate is rough, the total reflection phenomenon is thereby reduced and the light extraction efficiency of the LED is improved. Moreover, the transparent substrate has a rough surface, the total reflection phenomenon is thereby reduced and the light output intensity of the LED is improved.

Another aspect of the present invention is to provide a method for fabricating a flip-chip LED. The LED is supported by the transparent substrate instead of the traditional substrate, so that most light emitted from the LED is able to pass through the transparent substrate and be successfully output outwards. Thus, the superiority of the flip-chip LED can be hold for promoting the device reliability, and the light output intensity of the flip-chip LED is enhanced.

According to a fabricating method of the present invention, a second semiconductor layer (e.g., p-type semiconductor layer) is below the first semiconductor layer (e.g., n-type semiconductor layer) through a "twice reverse" process, the distance between the active layer and the transparent substrate thereby increases and the problem of total reflection phenomenon is reduced. The present invention makes use of the light emitted from the LED more effectively for improving the light output intensity greatly, and the brightness of LED is increased.

A flip-chip LED of the present invention includes a transparent substrate, an LED epitaxy structure, a metal reflective layer, a first electrode and a second electrode. The LED epitaxy structure is on the transparent substrate. The LED epitaxy structure includes a first upper surface and a second upper surface. The first upper surface and the second upper surface are different doped types. The metal reflective layer is positioned on the first upper surface and the second upper surface of the LED epitaxy structure. The first electrode is positioned on the metal reflective layer and the first upper surface is underneath the first electrode. The second electrode is positioned on the metal reflective layer and the second upper surface is underneath the second electrode.

A manufacturing method of the flip-chip LED of the present invention includes: forming an LED epitaxy structure on a substrate; bonding a transparent substrate to the LED epitaxy structure by utilizing a soft transparent adhesive layer; removing the substrate to expose a lower surface of the LED epitaxy structure; bonding a transparent substrate to the lower surface; removing the temporary substrate; etching the LED epitaxy structure to partially remove the LED epitaxy structure to a depth, so that the LED epitaxy structure includes a first upper surface and a second upper surface, the first upper surface and the second upper surface are of different doped types; forming a metal reflective layer on the first upper surface and the second upper surface of the LED epitaxy structure; and finally, fabricating a first electrode and a second electrode on the metal reflective layer respectively, in which the first upper surface of the LED epitaxy structure is underneath the first electrode and the second upper surface of the LED epitaxy structure is underneath the second electrode respectively.

Another manufacturing method of the flip-chip LED of the present invention includes: forming an LED epitaxy structure on a substrate; bonding a temporary substrate to the LED epitaxy structure; removing the substrate to expose a lower surface of the LED epitaxy structure; bonding a transparent substrate to the lower surface; removing the temporary substrate; etching the LED epitaxy structure to partially remove the LED epitaxy structure to a depth, therefore, the LED epitaxy structure includes a first upper surface and a second upper surface, the first upper surface and the second upper surface are of different doped types; forming a metal reflective layer on the first upper surface and the second upper surface of the LED epitaxy structure; and fabricating a first electrode and a second electrode on the metal reflective layer respectively, wherein the first upper surface of the LED epitaxy structure is underneath the first electrode and the second upper surface of the LED epitaxy structure is underneath the second electrode respectively.

Another manufacturing method of the flip-chip LED of the present invention includes: forming an LED die on a substrate; bonding a temporary substrate to the LED die; removing the substrate to exposure a lower surface of the LED die; bonding a transparent substrate to the lower surface; and removing the temporary substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, in which.

DETAILED DESCRIPTION

Embodiment 1

A flip-chip LED 10 is disclosed in accordance with the present invention. FIGS. 1A–1D are cross-sectional, schematic diagrams showing the process for forming the flip-chip LED 10 in accordance with the preferred embodiment of the present invention.

Figure 1A:
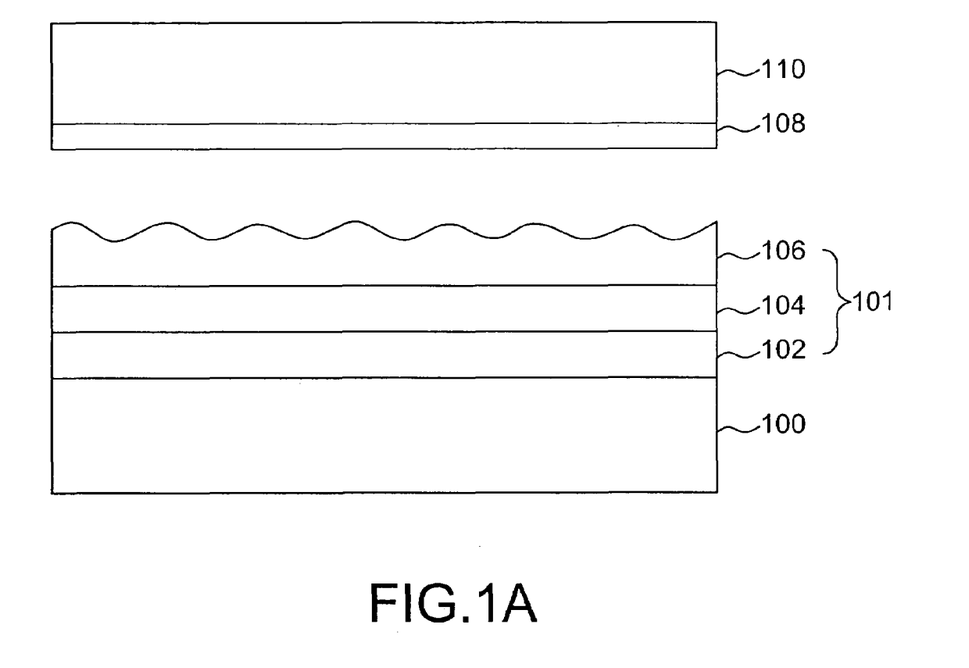
FIGS. 1A–1D are cross-sectional, schematic diagrams showing the process for forming the flip-chip LED in accordance with the preferred embodiment of the present invention.

In FIG. 1A, an LED epitaxy structure 101 is first formed on a substrate 100. The LED epitaxy structure 101 mentioned herein includes an AlGaInP LED epitaxy structure and an AlGaInN LED epitaxy structure. To obtain an epitaxy structure of high quality, the selected material of the substrate 100 corresponding to the AlGaInP LED epitaxy structure is Ge, GaAs or InP. As for the AlGaInN LED epitaxy structure, the preferred material of the substrate 100 is sapphire, SiC, Si, LiAlO$_2$, ZnO or GaN. The LED epitaxy structure 101 is fabricated by forming an n-type semiconductor layer 102, an active layer 104, and a p-type semiconductor layer 106 on the substrate 100. Further, the surface of the p-type semiconductor layer 106 is next roughened to form a rough surface; for example, a photolithography and etching process is utilized to micro-etch the surface of the p-type semiconductor layer 106 for producing surface roughness of the p-type semiconductor layer 106.

The active layer 104 may be a homo-structure, single hetero-structure, double hetero-structure, or multi-quantum well structure (MQW). The rough surface of the p-type semiconductor layer 106 is composed of bar-shaped, triangular, or round salient figures.

A transparent substrate 110 having a surface coated with a soft transparent adhesive layer 108 is then bonded to the LED epitaxy structure 101, in which the transparent substrate 110 is pasted down on the p-type semiconductor layer 106 by the adhesion property of the soft transparent adhesive layer 108. After combing the transparent substrate 110 and the LED epitaxy structure 101, the substrate 100 is removed to form a structure as shown in FIG. 1B, and the LED epitaxy structure 101 is completely transferred from the substrate 100 to the transparent substrate 110.

The selected materials of the transparent substrate 110 are transparent. In one preferred embodiment, the light emitted from the LED epitaxy structure 101 is able to pass through the transparent substrate 110 without being absorbed or aborted less than 50% by the transparent substrate 110. For example, the transparent substrate 110 may be made of sapphire, glass, GaP, or SiC. The soft transparent adhesive layer 108 may be made of bisbenzocyclobutene (BCB) resin for tightly bonding the transparent substrate 110 and the p-type semiconductor layer 106.

Figure 1B:
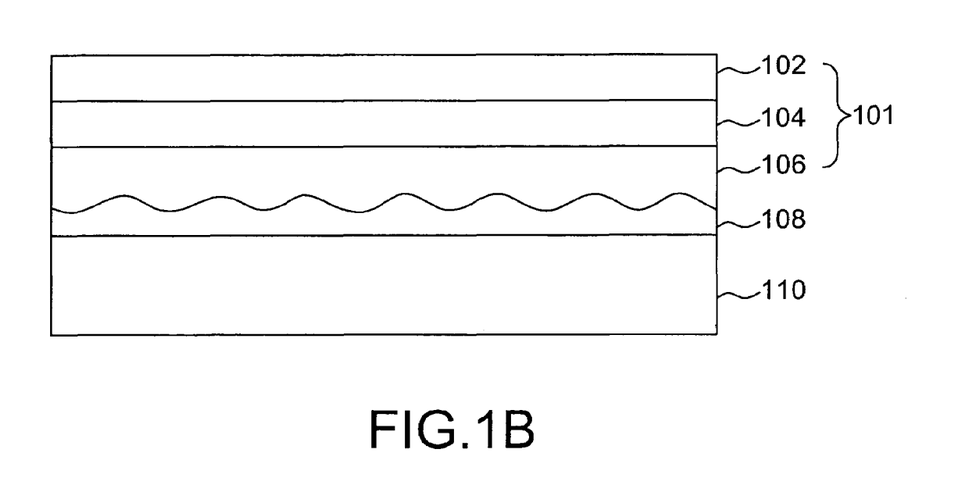
Figure 1C:
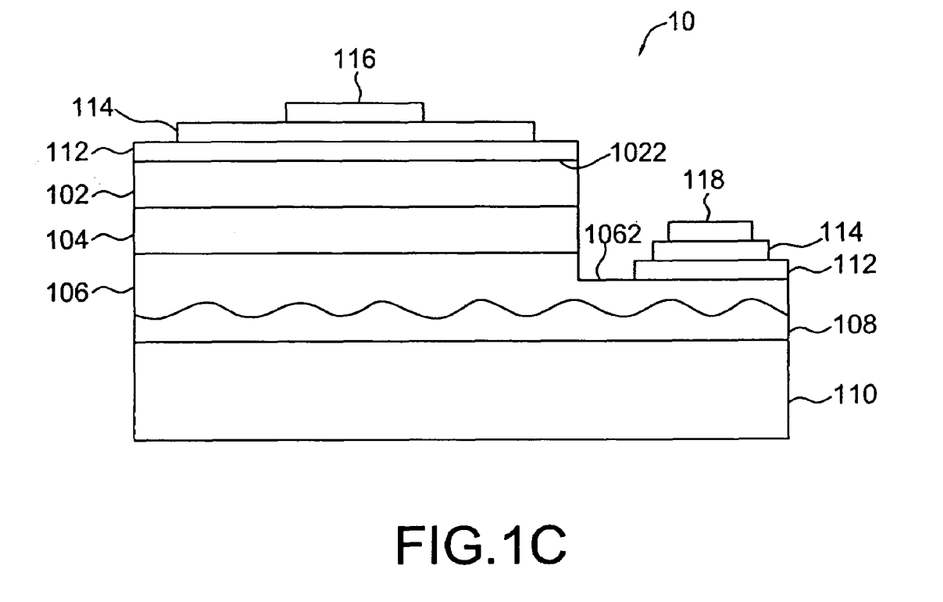

Next, referring to FIGS. 1B and 1C, an LED die manufacturing process is performed. First, a mesa-etching process is performed on the n-type semiconductor layer 102, the active layer 104, and the partial p-type semiconductor layer 106. The etching process is start with the surface of the n-type semiconductor layer 102, proceeds with the vertical direction, and then a portion of the LED epitaxy structure 101 is removed to a depth, so that a upper surface 1022 of the n-type semiconductor layer 102 is formed and a second upper surface 1062 of the p-type semiconductor layer 106 is exposed. Then, a metal reflective layer 112 and a barrier layer 114 are formed on the n-type semiconductor layer 102 and the p-type semiconductor layer 106. Finally, a cathode electrode (first electrode) 116 and an anode electrode (second electrode) 118 are fabricated on the barrier layer 114. The cathode electrode 116 and the anode electrode 118 are made from metal materials with good conductivity, such as Au or Al.

The metal reflective layer 112 is made from a metal material with high reflectivity for light; for example, Au, Al, Ag, or Ag alloy. The metal reflective layer 112 has a great capacity for reflecting the light emitted from the LED epitaxy structure 101. Further, the barrier layer 114 is utilized to prevent the cathode electrode 116 and the anode electrode 118 from metal diffusing into the metal reflective layer 112 and maintain the reflectivity of the metal reflective layer 112. The preferable material of the barrier layer 114 is Ni, W, TiN, WN, Pt, ZnO, or ITO.

Figure 1D:
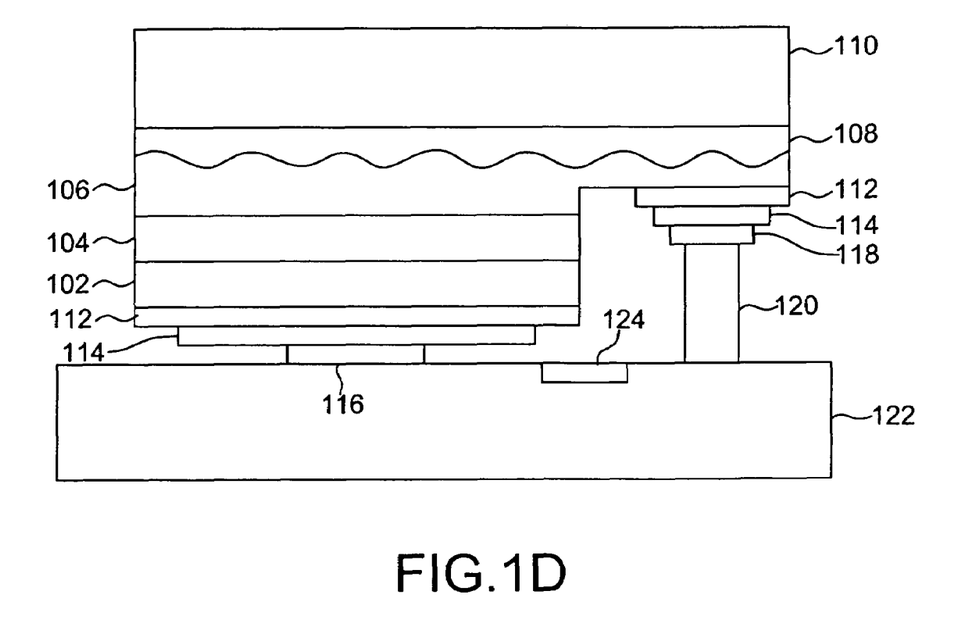

A solder 120 is formed above the barrier layer 114 to directly reverse onto a submount substrate 122 (as shown in FIG. 1D) for the following package process.

The embodiment utilizes the metal reflective layer 112 to reflect the light emitted downward from the LED epitaxy structure 101, as shown in FIG. 1D, and the reflected light becomes additional source of the light output.

Moreover, since there's a large difference in refractive index between the semiconductor materials in the LED epitaxy structure 101 (e.g. the index of reflection of GaN is about 2.4) and the external medium of the LED 10 (e.g. the index of reflection of air is about 1.5), and the light emitted upward from the LED epitaxy structure 101 is easily reflected back into the LED 10 making lower the light output efficiency. The transparent substrate 110 has its index of reflection between that of the external medium of the LED 10 (e.g. air) and that of the semiconductor layer (e.g. GaN).

Therefore, the light upward from the LED epitaxy structure 101 is able to pass through the transparent substrate 110 and output outwards without being blocked or absorbed by the transparent substrate 110. The rough surface of the p-type semiconductor layer 106 is utilized to form a rough interface of the transparent adhesive layer 108 and the LED epitaxy structure 101. The light scattering or refraction thus occurs at the interface reduces the total reflection phenomenon inside the LED 10 when the emitted light enters into the interface of the p-type semiconductor layer 106 and the transparent adhesive layer 108. The light extraction efficiency of the LED 10 is further improved.

Embodiment 2

Figure 2:
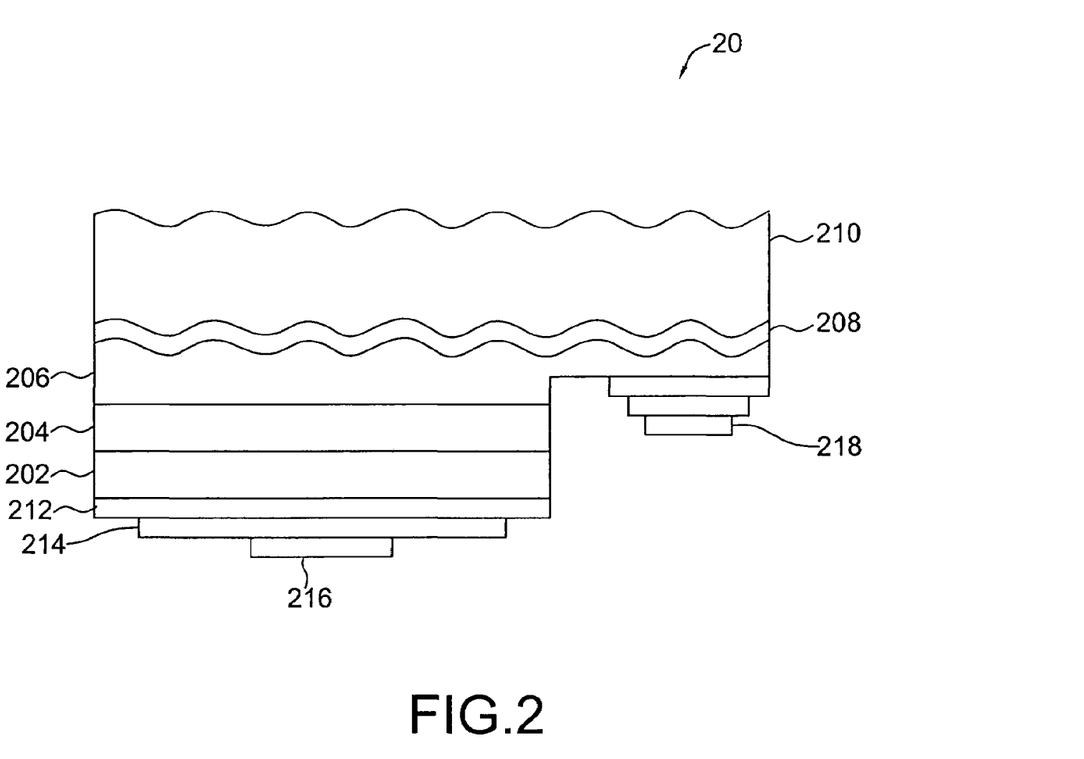
FIG. 2 is a cross-sectional, schematic diagram showing the structure of another flip-chip LED in accordance with the preferred embodiment of the present invention.

FIG. 2 shows a resulting structure of flip-chip LED 20 in accordance with the preferred embodiment of the present invention. With reference to FIG. 2 in which like reference numerals refer to like feature in FIGS. 1A–1D, and at a subsequent fabrication, the upper surface of the transparent substrate 210 is roughened to form a rough surface for improving the light output intensity, and the brightness of LED 20 is increased.

Moreover, not only the interface of the transparent substrate 210 and the soft transparent adhesive layer 208, but also the lower surface of the transparent substrate 210 is formed with roughness property.

The upper and lower surface of the transparent substrate 210 are either roughened before the soft transparent adhesive layer 208 is coated or by micro-etching the surface of transparent substrate 210 after the transparent substrate 210 is adhered to the p-type semiconductor layer 206.

Embodiment 3

FIGS. 3A–3D are cross-sectional, schematic diagrams showing the process for forming the flip-chip LED 30 in accordance with the preferred embodiment of the present invention.

Figure 3A:
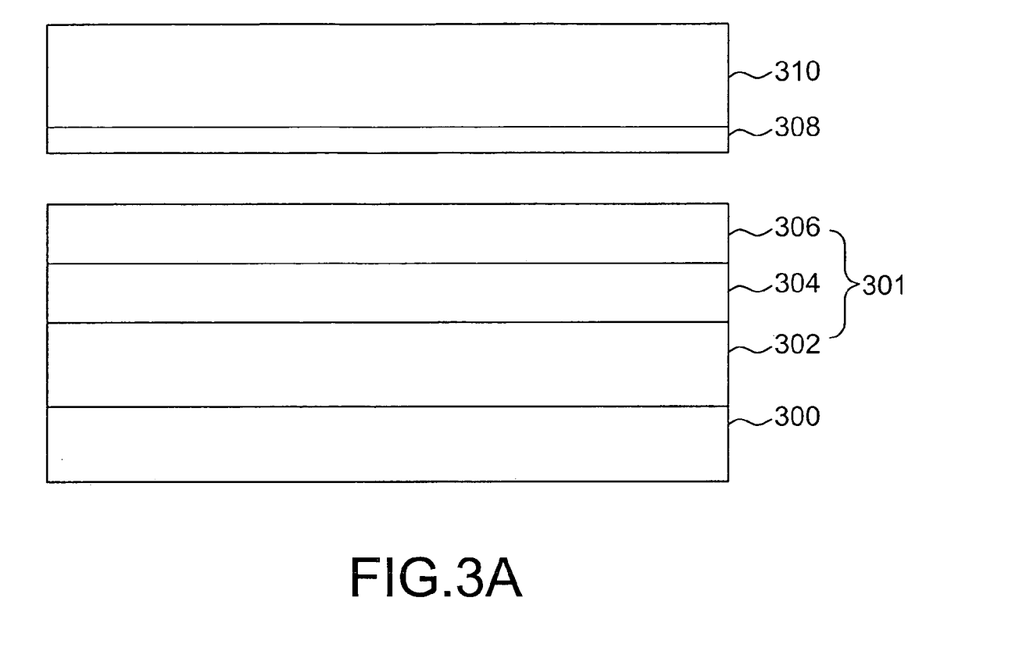
FIGS. 3A–3D are cross-sectional, schematic diagrams showing the process for forming the flip-chip LED in accordance with the preferred embodiment of the present invention.

The LED epitaxy structure 301 shown in FIG. 3A is fabricated by forming an n-type semiconductor layer 302, an active layer 304, and a p-type semiconductor layer 306 on the substrate 300 in accordance with the manufacturing steps of Embodiment 1. The active layer 304 of this embodiment (Embodiment 3) is similar to the active layer 104 of Embodiment 1, i.e. the active layer 304 may be a homo-structure, single hetero-structure, double hetero-structure, or multi-quantum well structure (MQW).

Figure 3B:
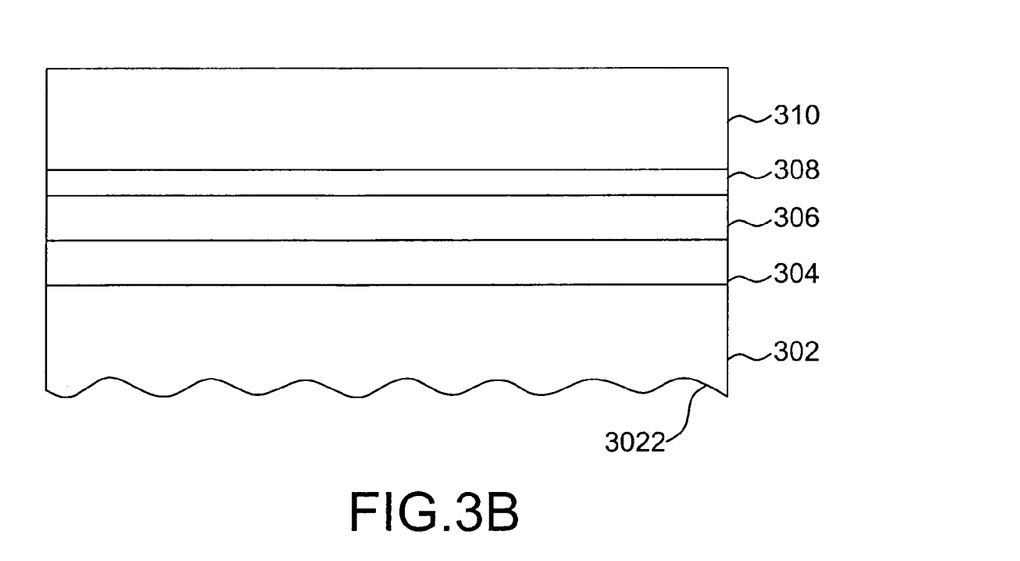
Figure 3C:
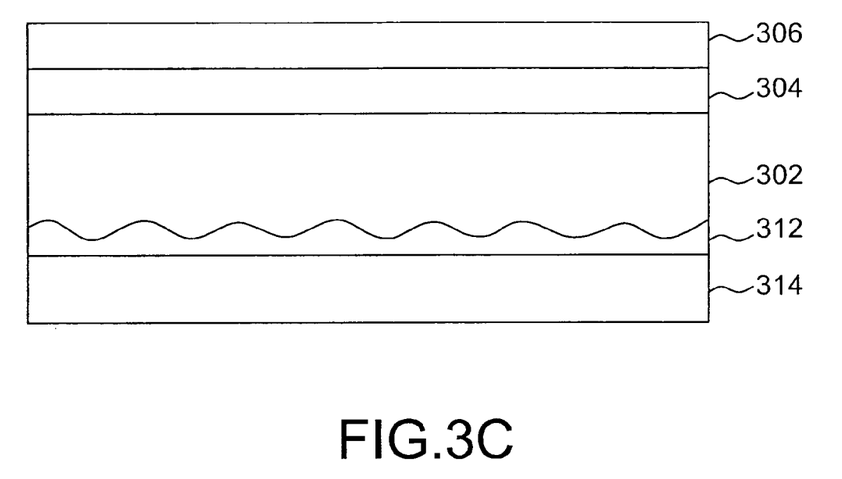

A temporary substrate 310 having a surface coated with a soft transparent adhesive layer 308 is then bonded to the LED epitaxy structure 301, in which the temporary substrate 310 is pasted down on the p-type semiconductor layer 306 by the adhesion property of the soft transparent adhesive layer 308. The temporary substrate 310 is then removed. Further, the surface of the n-type semiconductor layer 302 is next roughened to form a rough surface 3022; for example, a photolithography and etching process is utilized to micro-etch the surface of the n-type semiconductor layer 302 for producing surface roughness of the n-type semiconductor layer 302, i.e. the rough surface 3022, as shown in FIG. 3B. The "temporary substrate" 310 is used to support the LED epitaxy structure 301, therefore the selected material of the temporary substrate 310 should have good adhesion to the semiconductor layer but have to be easily removed. For example, the temporary substrate 310 may be made of glass, silicon, ceramic, and $Al_2O_3$. The selected material of the soft transparent adhesive layer 308 should also be easily removed. For example, the soft transparent adhesive layer 308 may be made of polyimide, glass and bisbenzocyclobutene (BCB) resin.

A transparent substrate 314 is then pasted down on the lower surface 3022 of the n-type semiconductor layer 302 by the adhesion property of the soft transparent adhesive layer 312. The material of the soft transparent adhesive layer 312 may be the same as that of the soft transparent adhesive layer 308; for example, BCB, polyimide, glass or epoxy, which results in good bonding of the transparent substrate 314 and n-type semiconductor layer 302. The material of the transparent substrate 314 is selected from sapphire, glass, GaP or SiC having the transparent property. The temporary substrate 310 and the soft transparent adhesive layer 308 are then removed to form a structure shown in FIG. 3C.

Figure 3D:
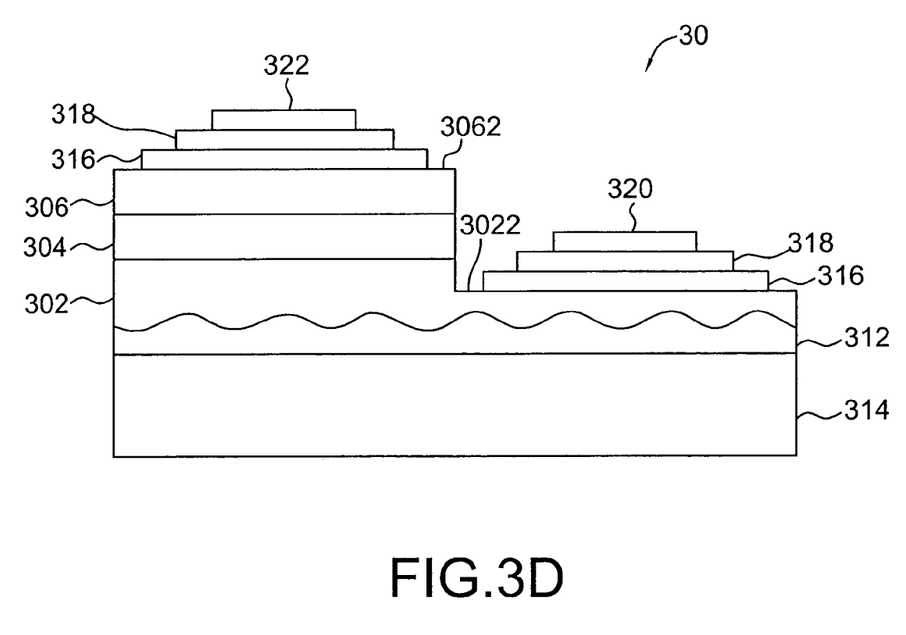

Next, an LED die manufacturing process is performed which is similar to the process described for FIGS. 1B and 1C. First, a mesa-etching process is performed on the p-type semiconductor layer 306, the active layer 304, and the portions of n-type semiconductor layer 302 to expose a first upper surface 3022 of the n-type semiconductor layer 302 and form a second upper surface 3062 of the p-type semiconductor layer 306. Then, a metal reflective layer 316 and a barrier layer 318 are formed. Finally, an anode electrode (e.g., first electrode) 320 and a cathode electrode (e.g., second electrode) 322 are fabricated on the barrier layer 318 to form a flip-chip LED 30 of the present invention, as shown in FIG. 3D. The materials of the metal reflective layer 316, barrier layer 318, anode electrode 320 or the cathode electrode 322 are respectively identical to those mentioned in Embodiment 1. It's noted that in Embodiment 1, the p-type semiconductor 106 is positioned near to the transparent substrate 110, but in Embodiment 3, the n-type semiconductor 302 is positioned near to the transparent substrate 314 by a "twice reverse" process. That is, in Embodiment 3, the distance between the active layer 304 and the transparent substrate 314 increases through the process of adhering two different substrates, i.e., temporary substrate 310 and transparent substrate 314. The light emitted from the active layer 304 to the external medium of the LED 30 thereby increases.

Embodiment 4

The resulting structure of a flip-chip LED of Embodiment 4 as the same to that of Embodiment 3 (shown in FIG. 3D), but their manufacturing methods are different as recited in the followings.

Figure 4A:
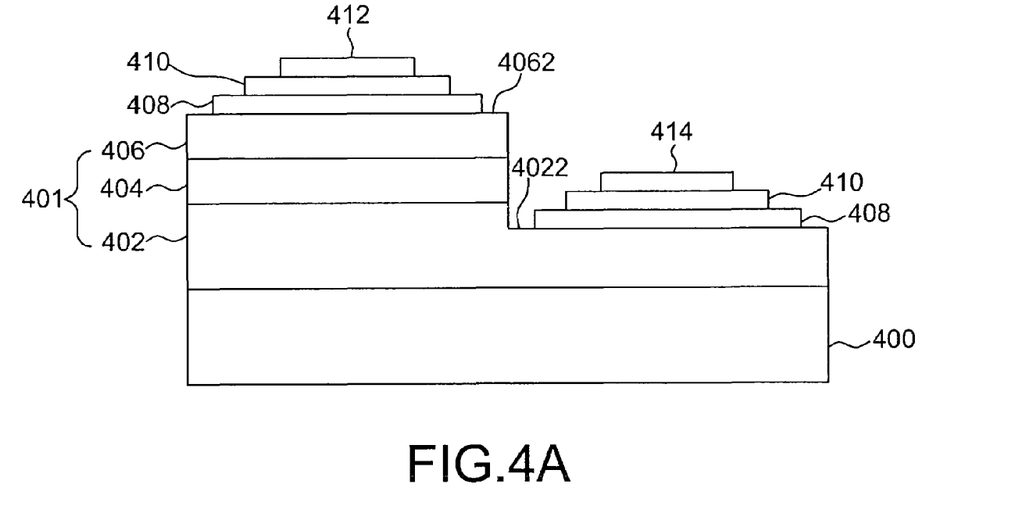
FIGS. 4A–4D are cross-sectional, schematic diagrams showing the process for forming the flip-chip LED in accordance with the preferred embodiment of the present invention.

An LED die is first fabricated by traditional methods. An n-type semiconductor layer 402, an active layer 404, and a p-type semiconductor layer 406 are formed on the substrate 400 to form an LED epitaxy structure 401. Next, a photolithography and etching process is utilized to form a first upper surface 4022 of the n-type semiconductor layer 402 and a second upper surface 4062 of the p-type semiconductor layer 406. A metal layer 408, a barrier layer 410, an anode electrode 414 and a cathode 412 are formed in accordance with Embodiment 1 to form an LED die shown in FIG. 4A.

Figure 4B:
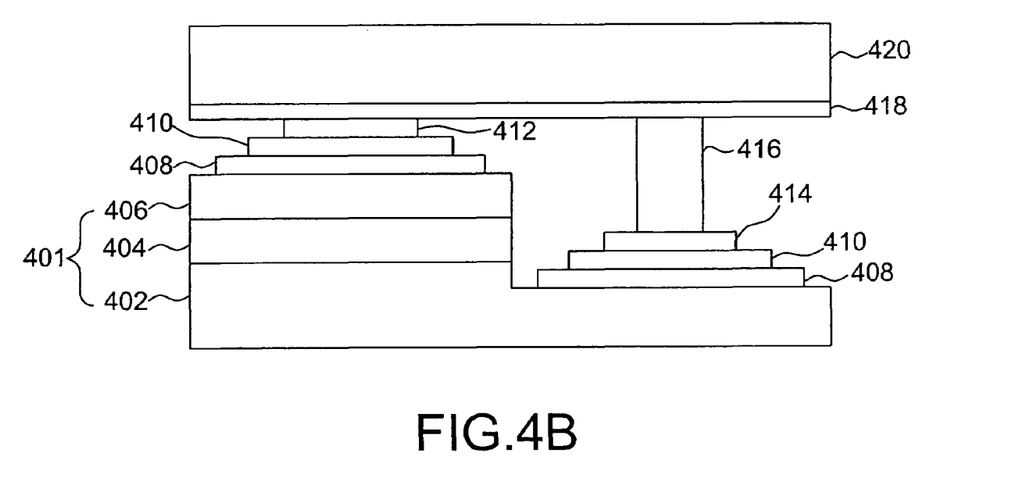

The temporary substrate 420 having a surface coated with a soft transparent adhesive layer 418 is then adhered to the cathode electrode 412 and a solder 416. The substrate 400 is then removed to form a structure shown in FIG. 4B.

Figure 4C:
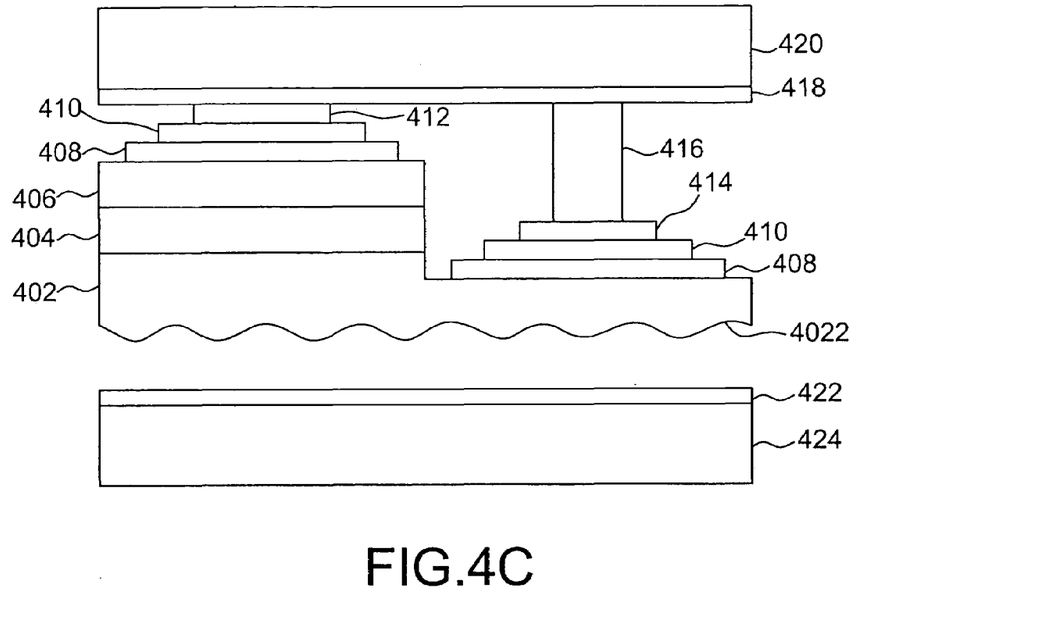
Figure 4D:
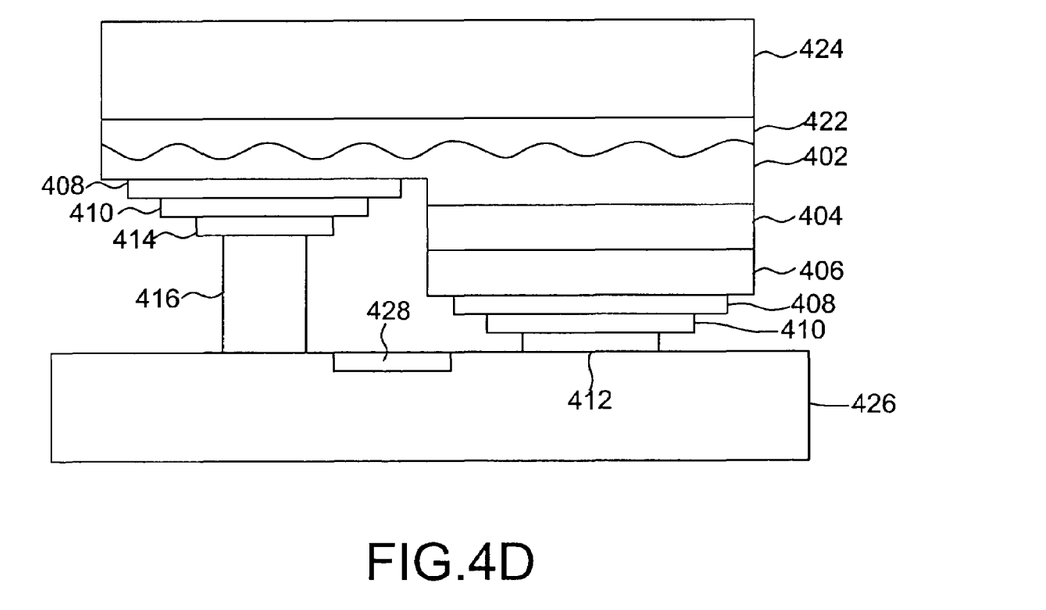

Referring to FIG. 4C, an exposed and lower surface of the n-type semiconductor layer 402 is next roughened. The lower surface of the n-type semiconductor layer 402 is mesa-etched by utilizing a photolithography and etching process to form a rough lower surface 4022. A transparent substrate 424 having a surface coated with a soft transparent adhesive layer 422 is then bonded to lower surface 4022 of the n-type semiconductor layer 402 by the adhesion property of the soft transparent adhesive layer 422. The temporary substrate 420 is removed to form the flip-chip LED. Referring to FIG. 4D, the flip-chip LED is directly flipped onto the submount substrate 426 for the following package process, wherein a region numbered 428 is an isolated area. Through the "two reverse" process, the n-type semiconductor layer 402 is near the transparent substrate 424 and positioned in the upper layer, and the p-type semiconductor 406 is positioned in the lower layer, the distance between the active layer 404 and the transparent substrate 424 thereby increases. The light emitted from the active layer 404 to the external medium of the LED increases. The surface of the transparent substrate 424 may be also roughened by microetching to improving the light extraction efficiency of the LED.

By means of the detailed descriptions of what is presently considered to be the most practical and preferred embodiments of the subject invention, it is the expectation that the features and the gist thereof are plainly revealed. Nevertheless, these above-mentioned illustrations are not intended to be construed in a limiting sense. Instead, it should be well understood that any analogous variation and equivalent arrangement is supposed to be covered within the spirit and scope to be protected and that the interpretation of the scope of the subject invention would therefore as much broadly as it could apply.

What is claimed is:

1. A method of manufacturing a flip-chip light emitting diode, comprising:
    forming a light emitting diode epitaxy structure on a substrate, the light emitting diode epitaxy having a lower surface facing toward the substrate and an upper face opposite the lower surface;
    bonding a temporary substrate to the upper face of the light emitting diode epitaxy structure;
    removing the substrate to expose the lower surface of the light emitting diode epitaxy structure;
    bonding a transparent substrate to the lower surface;
    removing the temporary substrate;
    etching the light emitting diode epitaxy structure to partially remove the light emitting diode epitaxy structure to a depth, whereby the light emitting diode epitaxy structure includes a first upper surface and a second upper surface, the first upper surface and the second upper surface are of different doped types;
    forming a metal reflective layer on the first upper surface and the second upper surface of the light emitting diode epitaxy structure; and
    fabricating a first electrode and a second electrode on the metal reflective layer respectively, wherein the first upper surface of the light emitting diode epitaxy structure is underneath the first electrode and the second upper surface of the light emitting diode epitaxy structure is underneath the second electrode respectively.

2. The method of claim 1, further comprising roughing the lower surface of the light emitting diode epitaxy structure before the step of bonding the transparent substrate to the lower surface.

3. The method of claim 1, wherein a soft transparent adhesive layer is used in the steps of bonding the temporary substrate to the light emitting diode epitaxy structure or the step of bonding the transparent substrate to the lower surface, and the soft transparent adhesive layer includes a material of bisbenzocyclobutene (BCB).

4. The method of claim 1, wherein the metal reflective layer includes a material of Rh, Au, Al, Ag or an alloy of Ag.

5. The method of claim 1, further comprising forming a barrier layer on the metal reflective layer.

6. The method of claim 5, wherein the barrier layer includes a material of Ni, W, WN, TiN, Pt, ZnO or ITO.

7. The method of claim 2, wherein the step of roughing the lower surface is performed by using lithography and etching technology.

8. The method of claim 1, wherein the step of forming the light emitting diode epitaxy structure comprises:
    forming a first semiconductor layer on the substrate;
    forming an active layer on the first semiconductor layer; and
    forming a second semiconductor layer on the active layer.

9. The method of claim 1, further comprising roughing a surface of the transparent substrate.

10. The method of claim 1, wherein the temporary substrate includes a material of glass, Si, ceramic or $Al_2O_3$.

11. A method of manufacturing a flip-chip light emitting diode, comprising:
    forming a light emitting diode die on a substrate, the light emitting diode die having a lower surface attached on the substrate:
    bonding a temporary substrate to an upper surface of the light emitting diode die;
    removing the substrate to exposure the lower surface of the light emitting diode die;
    bonding a transparent substrate to the lower surface; and
    removing the temporary substrate.

12. The method of claim 11, further comprising roughing the lower surface of the light emitting diode die before the step of bonding the transparent substrate to the lower surface.

13. The method of claim 12, wherein the step of roughing the lower surface is performed by using of lithography and etching technology.

14. The method of claim 11, wherein a soft transparent adhesive layer is used in the steps of bonding the temporary substrate to the light emitting diode die or the step of bonding the transparent substrate to the lower surface, and the soft transparent adhesive layer includes a material of bisbenzocyclobutene (BCB).

15. The method of claim 11, wherein the step of forming the light emitting diode die comprises:
    forming a first semiconductor layer on the substrate;
    forming an active layer on the first semiconductor layer;
    forming a second semiconductor layer on the active layer;
    etching the second semiconductor layer, the active layer and the first semiconductor layer to form a first upper surface of the first semiconductor layer and a second upper surface of the second semiconductor layer;
    forming a metal reflective layer on the first upper surface and the second upper surface; and
    fabricating a first electrode and a second electrode on the metal reflective layer respectively, wherein the first upper surface is underneath the first electrode and the second upper surface is underneath the second electrode respectively.

16. The method of claim 15, wherein the metal reflective layer includes a material of Rh, Au, Al, Ag or an alloy of Ag.

17. The method of claim 15, further comprising forming a barrier layer on the metal reflective layer.

18. The method of claim 17, wherein the barrier layer includes a material of Ni, W, WN, TiN, Pt, ZnO or ITO.

19. The method of claim 11, further comprising roughing a surface of the transparent substrate.

20. The method of claim 11, wherein the temporary substrate includes a material of glass, Si, ceramic or $Al_2O_3$.

* * * * *